United States Patent
Kaibara et al.

(10) Patent No.: US 9,245,845 B2
(45) Date of Patent: Jan. 26, 2016

(54) SEMICONDUCTOR DEVICE

(71) Applicant: Panasonic Intellectual Property Management Co., Ltd., Osaka (JP)

(72) Inventors: Kazuhiro Kaibara, Osaka (JP); Hiroshige Hirano, Toyama (JP)

(73) Assignee: PANASONIC INTELLECTUAL PROPERTY MANAGEMENT CO., LTD, Osaka (JP)

(*) Notice: Subject to any disclaimer, the term of this patent is extended or adjusted under 35 U.S.C. 154(b) by 0 days.

(21) Appl. No.: 14/736,625

(22) Filed: Jun. 11, 2015

(65) Prior Publication Data
US 2015/0279781 A1    Oct. 1, 2015

Related U.S. Application Data

(63) Continuation of application No. PCT/JP2013/006369, filed on Oct. 29, 2013.

(30) Foreign Application Priority Data

Dec. 21, 2012 (JP) .................. 2012-280096

(51) Int. Cl.
*H01L 23/528* (2006.01)
*H01L 23/482* (2006.01)
(Continued)

(52) U.S. Cl.
CPC ........ *H01L 23/5283* (2013.01); *H01L 23/4824* (2013.01); *H01L 24/05* (2013.01);
(Continued)

(58) Field of Classification Search
CPC .............. H01L 23/5283; H01L 23/528; H01L 23/4828; H01L 29/7787; H01L 29/0696; H01L 24/05
See application file for complete search history.

(56) References Cited

U.S. PATENT DOCUMENTS

2007/0052068 A1* 3/2007 Takemura ............... H01L 22/32
                                                              257/637
2008/0149940 A1   6/2008 Shibata et al.
(Continued)

FOREIGN PATENT DOCUMENTS

JP    2008-177527    7/2008
JP    2009-141064    6/2009
(Continued)

OTHER PUBLICATIONS

International Search Report of PCT application No. PCT/JP2013/006369 dated Feb. 10, 2014.
(Continued)

*Primary Examiner* — Peniel M Gumedzoe
(74) *Attorney, Agent, or Firm* — McDermott Will & Emery LLP

(57) ABSTRACT

A semiconductor device includes a first wiring layer stacked over element electrodes above a silicon substrate and a second wiring layer stacked over the first wiring layer. The first wiring layer includes first source electrode wires and first drain electrode wires. The second wiring layer includes second source electrode wires and second drain electrode wires. The first wiring layer includes a first region and second regions. In the first region, each of the first source electrode wires and the first drain electrode wires is continuous. In each of the second regions, each of the first source electrode wires and the first drain electrode wires is discontinuous. Second source electrode wires and second drain electrode wires are arranged to alternately over the first regions and the second regions in one direction. External connection terminals are not connected over the second regions, and are connected over the first regions.

6 Claims, 8 Drawing Sheets

(51) Int. Cl.
*H01L 29/778* (2006.01)
*H01L 29/06* (2006.01)
*H01L 23/00* (2006.01)
*H01L 29/66* (2006.01)
*H01L 29/20* (2006.01)

(52) U.S. Cl.
CPC ........ *H01L29/0696* (2013.01); *H01L 29/7787* (2013.01); *H01L 24/45* (2013.01); *H01L 24/48* (2013.01); *H01L 29/2003* (2013.01); *H01L 29/66462* (2013.01); *H01L 2224/02166* (2013.01); *H01L 2224/04042* (2013.01); *H01L 2224/05027* (2013.01); *H01L 2224/05147* (2013.01); *H01L 2224/05567* (2013.01); *H01L 2224/05573* (2013.01); *H01L 2224/05639* (2013.01); *H01L 2224/05644* (2013.01); *H01L 2224/05647* (2013.01); *H01L 2224/05655* (2013.01); *H01L 2224/45015* (2013.01); *H01L 2224/45124* (2013.01); *H01L 2224/45144* (2013.01); *H01L 2224/45147* (2013.01); *H01L 2224/48639* (2013.01); *H01L 2224/48644* (2013.01); *H01L 2224/48647* (2013.01); *H01L 2224/48655* (2013.01); *H01L 2224/48739* (2013.01); *H01L 2224/48744* (2013.01); *H01L 2224/48747* (2013.01); *H01L 2224/48755* (2013.01); *H01L 2224/48839* (2013.01); *H01L 2224/48844* (2013.01); *H01L 2224/48847* (2013.01); *H01L 2224/48855* (2013.01)

(56) References Cited

U.S. PATENT DOCUMENTS

| | | |
|---|---|---|
| 2009/0146313 A1 | 6/2009 | Terazono et al. |
| 2009/0184424 A1 | 7/2009 | Furusawa et al. |
| 2012/0091986 A1 | 4/2012 | Takemae et al. |
| 2012/0221759 A1* | 8/2012 | Yokouchi ............ H01L 23/4824 710/306 |
| 2012/0313147 A1* | 12/2012 | Anderson ............ H01L 23/485 257/204 |
| 2013/0176013 A1 | 7/2013 | Takemae et al. |
| 2013/0241067 A1 | 9/2013 | Furusawa et al. |

FOREIGN PATENT DOCUMENTS

| | | |
|---|---|---|
| JP | 2009-170763 | 7/2009 |
| JP | 2012-039001 | 2/2012 |
| JP | 2012-084743 | 4/2012 |

OTHER PUBLICATIONS

Yuji Ando et al. "Characterization of High Breakdown Voltage AlGaN/GaN Heterojunction FETs with a Field Place Gate", Technical Report of IEICE. ED2002-214, CPM2002-105(Oct. 2002) pp. 29-34.

* cited by examiner

BONDING WIRE BONDING REGION

SECOND WIRING LAYER

FIRST WIRING LAYER under the pad. In particular, in the case of a power device with a large amount of current flowing therein, such a wire or ribbon is increased in size to increase the damage to the lower films.

SEMICONDUCTOR DEVICE

CROSS REFERENCE TO RELATED APPLICATIONS

This is a continuation application of PCT International Application No. PCT/JP2013/006369 filed on Oct. 29, 2013, designating the United States of America, which is based on and claims priority of Japanese Patent Application No. 2012-280096 filed on Dec. 21, 2012. The entire disclosures of the above-identified applications, including the specifications, drawings and claims are incorporated herein by reference in their entirety.

BACKGROUND OF THE INVENTION

1. Field of the Invention

The present disclosure relates to semiconductor devices, and more particularly to a horizontal semiconductor device having wiring and electrode pads over active regions.

2. Description of the Related Art

Among semiconductor devices, in particular, III-V nitride semiconductors, in other words, mixed crystals expressed by a general expression of $Al_xGa_{1-x-y}In_yN$ (where $0 \leq x \leq 1$, $0 \leq y \leq 1$), such as gallium nitride (GaN), aluminum nitride (AlN), and indium nitride, are physically characterized by a wide bandgap and a direct transition band structure, which allow the mixed crystals to be applied to short wavelength optical elements. Furthermore, such mixed crystals are applied not only to the short wavelength optical elements. Since these mixed crystals have a high breakdown electric field and a high saturated electron velocity, they have been examined to be applied also to electronic devices.

In particular, a hetero-junction field effect transistor (HFET), which is manufactured using two-dimensional electron gas (2DEG) generated at an interface between an $Al_xGa_{1-x}N$ layer (where $0<x \leq 1$) and a GaN layer which are sequentially grown above a semi-insulating substrate by an epitaxial growth technique, has been developed as an high output device or a radio-frequency device. This HFET receives supply of electrical charges caused by polarization effects including spontaneous polarization and piezoelectric polarization in addition to supply of electrons from a carrier supply layer (N-type AlGaN Schottky layer). An electron density of an HFET exceeds $10^{13}$ cm$^{-2}$, which is greater than an electron density of an AlGaAs/GaAs HFET by approximately one digit. As described above, an HFET including a III-V nitride semiconductor is expected to offer a higher drain current density than that of a GaAs HFET, and it is disclosed that there is a III-V nitride semiconductor having a maximum drain current exceeding 1 A/mm (see Non Patent Literature 1). Furthermore, a III-V nitride semiconductor, which has a wide bandgap (for example, GaN has a bandgap of 3.4 eV), has also a high breakdown voltage, and an HFET including such a III-V nitride semiconductor therefore has a gate-to-drain breakdown voltage of 100 V or higher (see Non Patent Literature 1). As described above, electronic devices represented by an HFET including a III-V nitride semiconductor are expected to offer electrical properties of a high breakdown voltage and a high current density, and therefore examined for applications to radio-frequency devices and to devices with a smaller design size and a larger power amount than conventional electronic devices.

As described above, a III-V nitride semiconductor device can reduce its active region in size to approximately one third to one tenth of that in a silicon (Si) semiconductor device. However, the conventional III-V nitride semiconductor devices need a large area for electrode pads for wiring connection, thereby failing to sufficiently reduce their sizes. In particular, in application to a power device in which a large amount of current flows, a diameter of wire and a size of a ribbon which are connected to the electrode pads are desirably large. In order to address this, there is a limit to reduce the size of electrode pads. Therefore, a structure in which electrode pads are formed over active regions, which is called a pad-on-element structure, has been examined (see Patent Literature 1).

CITATION LIST

Patent Literature

Patent Literature (PTL) 1: Japanese unexamined patent application publication No. 2008-177527

Non Patent Literature

Non Patent Literature (NPTL) 1: "Koutaiatsu AlGaN/GaN hetelo setsugou FET no hyouka", Yuji Ando, Yasuhiro Okamoto, Hironobu Miyamoto, Tatsumine Nakayama, Takashi Inoue, Masaaki Kuzuhara, Shingakugihou, ED2002-214, CPM2002-105 (2002-10), pp. 29-34

SUMMARY OF THE INVENTION

In the pad-on-element structure disclosed in PTL 1, when an external connection terminal, such as a wire or a ribbon, is connected to a pad, it is important to suppress damage to interlayer films under the pad. In particular, in the case of a power device with a large amount of current flowing therein, such a wire or ribbon is increased in size to increase the damage to the lower films.

In order to address the above-described problems of the conventional techniques, an object of the present disclosure is to provide a semiconductor device having a pad-on-element structure in which wires under external connection pads are unlikely to be damaged while keeping high-power properties.

In order to solve the above-described problems, in accordance with an aspect of the present disclosure, there is provided a semiconductor device including: an electrode layer disposed in an active region above a semiconductor substrate; a first wiring layer disposed above the electrode layer; and a second wiring layer disposed above the first wiring layer, wherein the first wiring layer includes a plurality of first electrode wires electrically connected to element electrodes included in the electrode layer, the second wiring layer includes a plurality of second electrode wires arranged parallel to each other and electrically connected to at least one of the first electrode wires, the first wiring layer includes first regions and second regions, and in a plan view of the semiconductor substrate, the first electrode wires are each continuous in the first regions and each discontinuous in the second regions, the second electrode wires are arranged to regularly and alternately cover the first regions and the second regions, a corresponding one of the first regions and a corresponding one of the second regions being arranged in a longitudinal direction of each of the second electrode wires, and external connection terminals are not bonded over the second regions and are bonded over the second electrode wires over the first regions.

When the external connection terminals are bonded above the second wiring layer, the bonding causes stress on portions of the first wiring layer under the bonding regions. The damage caused by the stress to the first wiring layer is likely to be concentrated in the second regions in each of which each first electrode wires is discontinuous. On the other hand, the damage is reduced in the first regions in each of which each first electrode wire is continuous under the bonding regions. This structure can suppress the damage caused by the external connection terminal.

Furthermore, the second electrode wires are arranged to alternately cover the first regions and the second regions, and the pads for the external connection terminals are selectively provided over the first regions. It is therefore possible to prevent that the first electrode wire extends under two neighbor second electrode wires. This structure can decrease a length of the first electrode wires, thereby suppressing increase of on-resistance and decrease of a maximum current amount caused by decrease of a gate potential.

It is still further possible that each of the second regions includes longitudinal ends of at least one of the first electrode wires, and each of the first regions is free from longitudinal ends of the first electrode wires.

This structure can suppress damage caused by the external connection terminal, and minimize the length of the first electrode wires.

It is still further possible that the electrode layer includes a gate electrode, a source electrode, and a drain electrode, the first electrode wires include a first gate electrode wire electrically connected to the gate electrode, a first source electrode wire electrically connected to the source electrode, and a first drain electrode wire electrically connected to the drain electrode, and the first gate electrode wire is disposed between longitudinal ends of the first source electrode wires and between longitudinal ends of the first drain electrode wires in each of the second regions.

With this structure, the first gate electrode wire can segment each of the first source electrode wire and the first drain electrode wire to be smaller than a chip size. As a result, the length of each of the first source electrode wire and the first drain electrode wire is decreased, thereby suppressing increase of on-resistance and decrease of a maximum current amount caused by decrease of a gate potential.

It is still further possible that the semiconductor device further includes an electrode pad layer disposed above the second wiring layer, wherein external connection terminals are bonded only in a part of the electrode pad layer, the part having a same potential as a potential of the second wiring layer in a vertical direction.

Conventionally, when the external connection terminals are bonded directly to the second wiring layer, it is necessary to bond the external connection terminals to all the second electrode wires. In contrast, with the above structure according to the aspect of the present disclosure, the electrode pad layer connects a plurality of the second electrode wires having the same potential to one another. As a result, it is possible to reduce the number of the external connection terminals. Furthermore, with the above structure, the external connection terminals are bonded to parts of the electrode pad layer which have the same potential as the potential of the second wiring layer in a vertical direction. As a result, when there is no interlayer insulating film between the second wiring layer and the electrode pad layer under the bonding region, the bonding causes the second wiring layer and the electrode pad layer to be into contact with each other. Moreover, the above structure can suppress damage caused by the contact. In addition, if there is an interlayer insulating film between the second wiring layer and the electrode pad layer, the second wiring layer and the electrode pad layer have the same potential under the bonding region. Therefore, the damage is unlikely to affect the properties of the semiconductor device.

It is still further possible that each of the second electrode wires includes regions having different widths.

It is still further possible that each of the second electrode wires has a first width over at least one of the first regions and a second width over at least one of the second regions, the first width being greater than the second width.

In the region in which the external connection terminal is not connected to the second electrode wire, the second electrode wire does not need have an enough width for bonding. In other words, in the second region of the first electrode wire, the width of the second electrode wire can be reduced. This structure can reduce a length of the first electrode wire, thereby suppressing increase of on-resistance and decrease of a maximum current amount caused by decrease of a gate potential.

Thus, in the semiconductor device according to the present disclosure, wires under bonding regions for external connection terminals are not damaged. It is therefore possible to suppress increase of on-resistance and decrease of a maximum current amount caused by decrease of a gate potential.

DETAILED DESCRIPTION OF THE PREFERRED EMBODIMENTS

Comparison Examples

Figure 7:
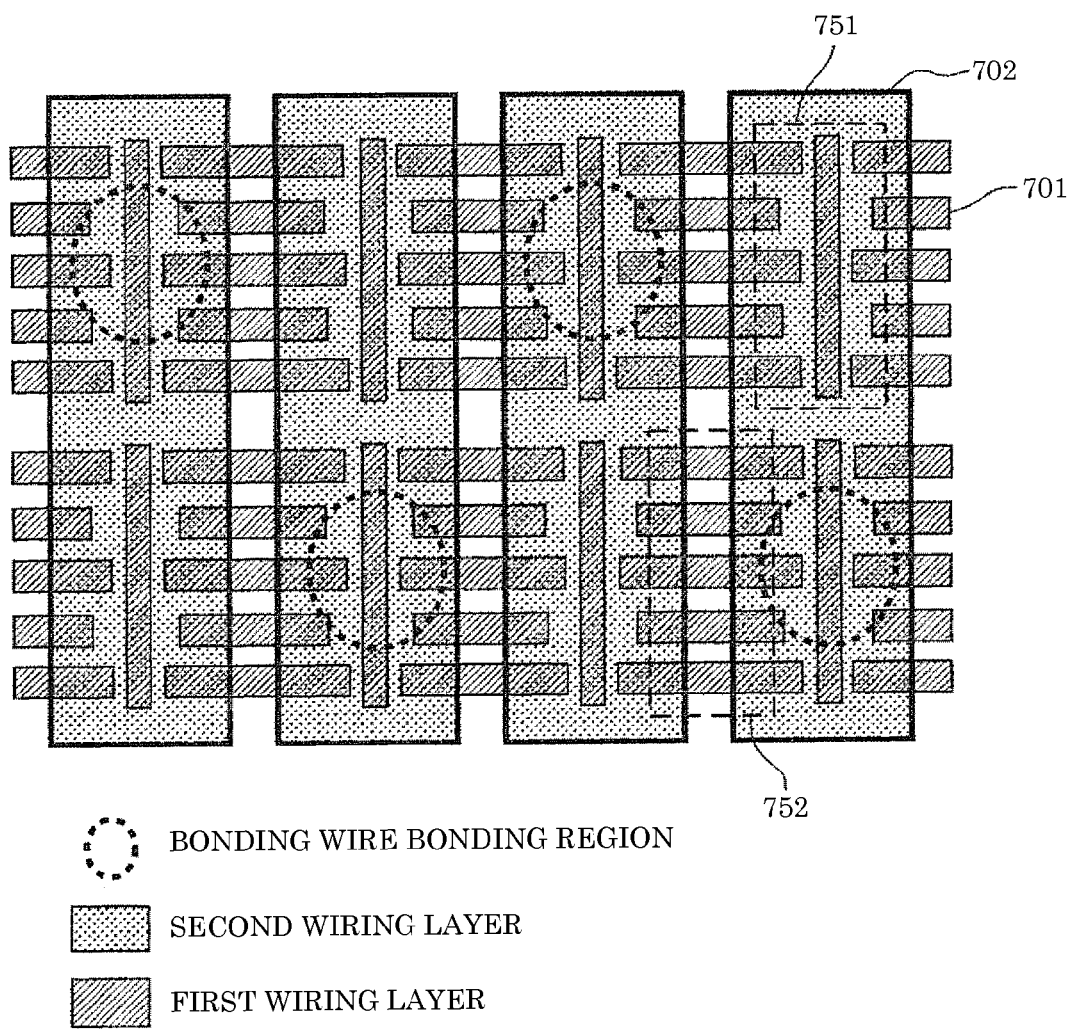
FIG. 7 is a wiring layout diagram of a semiconductor device in which ends of wires are located under external wire connection regions, according to a comparison example.

FIG. 7 is a wiring layout diagram of a semiconductor device according to a comparison example in which ends of wires are under external wire connection regions (hereinafter, referred to also as "bonding wire bonding regions"), according to a comparison example. Referring to the layout diagram in FIG. 7, the semiconductor device according to the comparison example includes: an electrode layer (not illustrated) in an element region above a semiconductor substrate; a first wiring layer above the electrode layer; a second wiring layer above the first wiring layer; and bonding wires above the second wiring layer. The first wiring layer includes first wires 701, while the second wiring layer includes second wires 702. There are electrical connections between electrodes in the electrode layer and first wires 701, between first wires 701 and second wires 702, and between second wires 702 and the bonding wires.

If regions 751 in which the ends of first wires 701 are located are provided under regions in which the bonding wires are bonded (hereinafter, referred to as "bonding wire bonding region"), damage caused by stress of the connection of the bonding wires to second wires 702 tends to be concentrated on the vicinity of the ends of first wires 701. In consideration of the tendency, it is desirable to cause regions 752, in which the ends of first wires 701 are not located, to be arranged under the bonding wire bonding regions. A wiring layout achieving the above is shown in FIG. 8.

Figure 8:
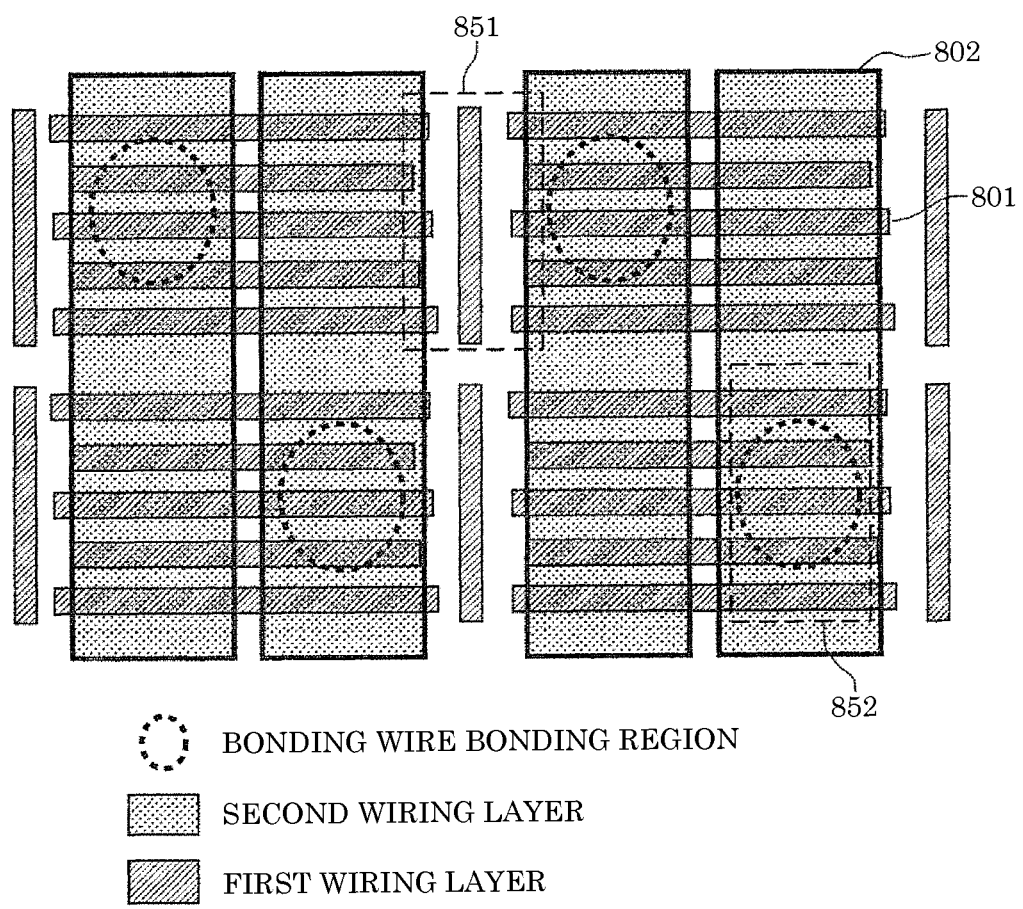
FIG. 8 is a wiring layout diagram of a semiconductor device in which ends of wires are not located under external wire connection regions, according to another comparison example.

FIG. 8 is a wiring layout diagram of a semiconductor device according to another comparison example in which ends of wires are not located under external wire connection regions (bonding wire bonding regions), according to another comparison example. Referring to the layout diagram illustrated in FIG. 8, in the same manner in FIG. 7, the semiconductor device according to the other comparison example includes: an electrode layer; a first wiring layer above the electrode layer; a second wiring layer above the first wiring layer; and bonding wires above the second wiring layer. The first wiring layer includes first wires 801, while the second wiring layer includes second wires 802.

In the wiring layout of FIG. 8, first wires 801 are considerably long, and the bonding wires are connected above regions 852 in which the ends of first wires 801 are not located. In this case, however, the length of first wire 801 is equal to or more than double the width of the bonding wire bonding region. In the case of a horizontal device, such as a GaN device, longer first wires 801 increase on-resistance of the whole device, and also decrease a gate potential caused by a floating source potential or gate leakage at the ends of first wires 801. The decrease of a gate potential decreases a gate-to-source potential difference $\Delta V_{GS}$, eventually failing to obtain sufficient maximum current.

In other words, if each of wires is discontinuous under an external connection pad, stress, such as load or ultrasonic waves caused by bonding the external connection terminals is concentrated on the discontinuous portion of the wires which are therefore likely to be damaged.

Embodiment 1

The following describes Embodiment 1 with reference to FIGS. 1 to 3G, comparing to the comparison examples.

It should be noted that the structural elements having the same names are identical even if they are assigned with different reference numerals in the figures.

[Structure of Semiconductor Device]

Figure 1:
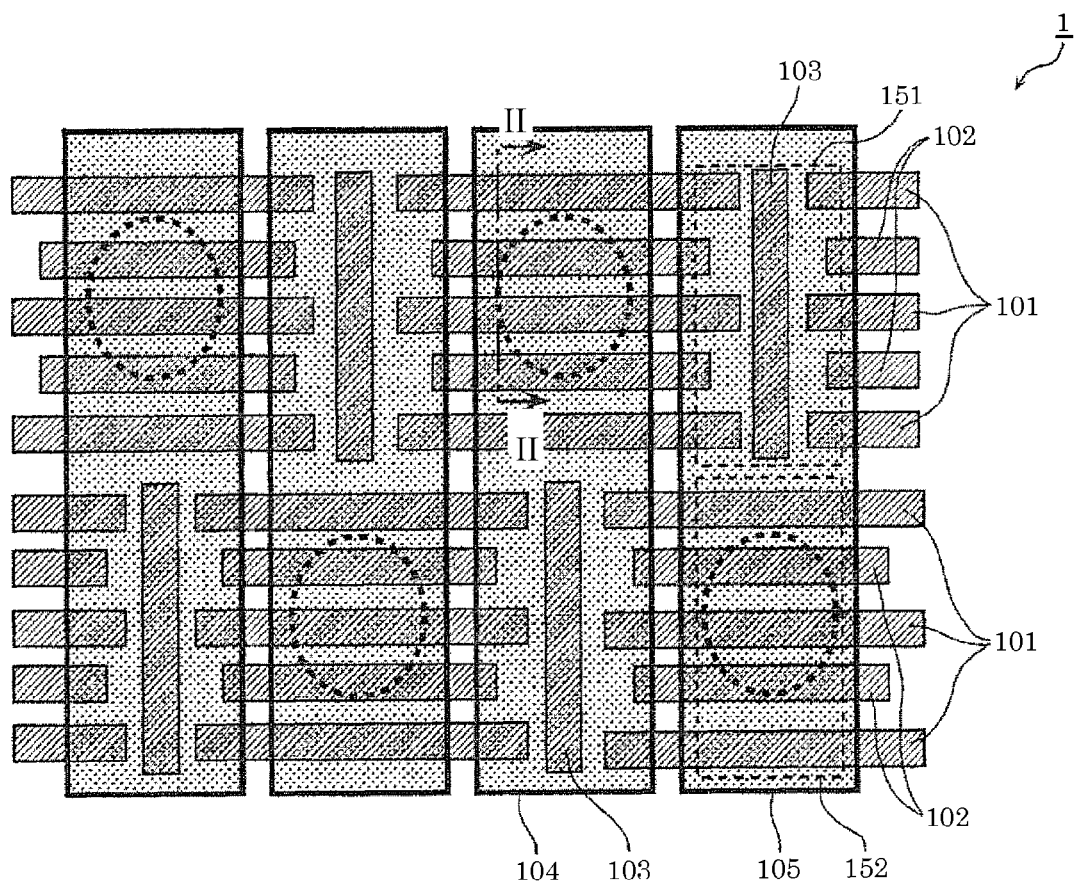
FIG. 1 is a wiring layout diagram of a semiconductor device according to Embodiment 1.
Figure 1:
Figure 1:

FIG. 1 is a wiring layout diagram of a semiconductor device according to Embodiment 1. More specifically, FIG. 1 illustrates an example of a layout of a first wiring layer and a second wiring layer in a nitride semiconductor device serving as field effect transistors. Referring to FIG. 1, semiconductor device 1 according to Embodiment 1 includes first source electrode wires 101, first drain electrode wires 102, and first gate electrode wires 103, all of which are provided in the first wiring layer and over active regions which will be described later. The first wiring layer is provided on source electrodes, drain electrodes, and gate electrodes, which form transistors.

Furthermore, the second wiring layer is stacked on the first wiring layer. The second wiring layer includes second source electrode wires 104 and second drain electrode wires 105.

Figure 2:
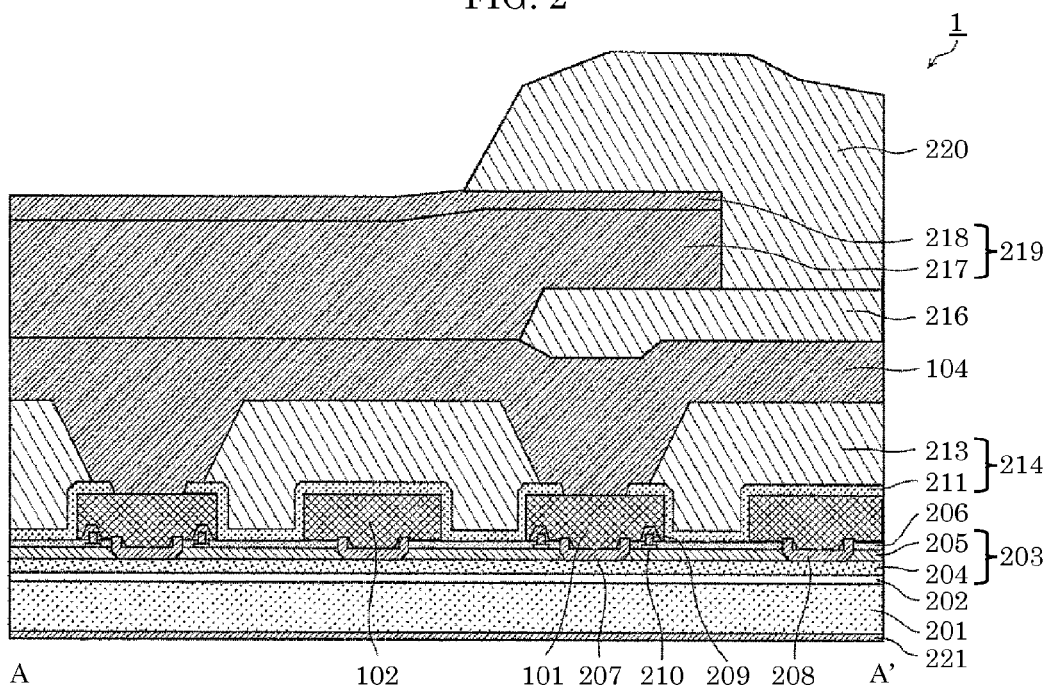
FIG. 2 is a cross-sectional view of the semiconductor device according to Embodiment 1.

FIG. 2 is a cross-sectional view of semiconductor device 1 according to Embodiment 1. More specifically, FIG. 2 is a cross-sectional view taken along line II-II in FIG. 1. Referring to FIG. 2, in semiconductor device 1 according to Embodiment 1, nitride semiconductor layer 203 is provided above silicon (Si) substrate 201 via buffer layer 202. Nitride semiconductor layer 203 includes undoped GaN layer 204 having a thickness of 2.5 µm and undoped AlGaN layer 205 having a thickness of 50 nm which are sequentially stacked from the substrate side. Two-dimensional electron gas (2DEG) is generated on an interface region between undoped GaN layer 204 and undoped AlGaN layer 205, thereby forming a channel region.

Source electrodes 207 and drain electrodes 208 are alternately arranged with intervals on nitride semiconductor layer 203. In Embodiment 1, in order to reduce contact resistance, a part of undoped AlGaN layer 205 and a part of undoped GaN layer 204 are removed to cause source electrodes 207 and drain electrodes 208 to reach a position lower than the interface between undoped AlGaN layer 205 and undoped GaN layer 204. Source electrodes 207 and drain electrodes 208 comprise metal, such as titanium (Ti) or aluminum (Al).

Undoped AlGaN layer 205 is thin with a width of 1 µm in a portion between source electrode 207 and drain electrode 208. On such a thin part of undoped AlGaN layer 205, p-type GaN layer 210 having a thickness of 200 nm and doped with magnesium (Mg) is provided. Gate electrode 209 comprising palladium (Pd), gold (Au), platinum (Pt), or the like is provided on p-type GaN layer 210.

A boundary between p-type GaN layer 210 and undoped AlGaN layer 205 is a p-n junction. Therefore, a depleted layer appears in undoped AlGaN layer 205 and undoped GaN layer 204, extending from p-type GaN layer 210 towards substrate 201 and towards drain electrode 208, even if a voltage applied to gate electrode 209 is 0 V. This depleted layer blocks current flowing in the channel region. As a result, operation in a normally off stage is possible.

Nitride semiconductor device 1 according to Embodiment 1 includes field effect transistors (FETs) having a multi-finger structure as illustrated in FIG. 1. In the multi-finger structure, assuming that single source electrode 207, single gate electrode 209, and single drain electrode 208 form a single transistor (in other words, one unit), a plurality of such transistors are arranged symmetrical with respect to drain electrode 208. Source electrodes 207 in the different transistors are electrically connected to one another, gate electrodes 209 in the different transistors are electrically connected to one another, and drain electrodes 208 in the different transistors are electrically connected to one another. This structure can increase a total gate width of nitride semiconductor device 1, thereby achieving a power device capable of operations requiring a large amount of current. According to Embodiment 1, regions that are not dielectrically isolated are active regions. In other words, the active regions include (a) regions provided with source electrodes 207 and drain electrodes 208 in nitride semiconductor layer 203 and (b) the channel regions in nitride semiconductor layer 203. Source electrodes 207, drain electrodes 208, and gate electrodes 209 are element electrodes in the electrode layer provided in the active regions above Si substrate 201.

Insulating film 206 comprising silicon nitride (SiN) and having a thickness of 300 nm except openings above source electrodes 207 and drain electrodes 208 is provided above nitride semiconductor layer 203, p-type GaN layers 210, and gate electrodes 209. The provision of insulating film 206 stabilizes the surface of nitride semiconductor layer 203, and prevents water from entering nitride semiconductor layer 203 from insulating film 213 which will be described later.

First source electrode wires 101 and first drain electrode wires 102 are provided above source electrodes 207 and drain electrodes 208, respectively, via the openings of insulating film 206. Each of first source electrode wires 101 and first drain electrode wires 102 includes an Al film and a Ti film serving as an adherence barrier layer which are sequentially stacked. As described previously, first gate electrode wires 103 (not illustrated in FIG. 2), first source electrode wires 101, and first drain electrode wires 102 are first electrode wires in the first wiring layer. Each of these electrode wires has a thickness of 2 μm and a width equal to or greater than a width of source electrode 207 or drain electrode 208 located under the electrode wire. Here, single first source electrode wire 101 covers gate electrodes 209 included in two neighbor transistors, so that the width of first source electrode wire 101 increases towards drain electrodes 208. With this structure, first source electrode 101 suppresses damage on gate electrodes 209 which is caused by the external connection terminals. In addition, first source electrode 101 also serves as a source field plate.

An SiN film having a thickness of 800 nm is provided as insulating film 211 above insulating film 206 and the first wiring layer. Like insulating film 206, the SiN film protects nitride semiconductor layer 203 from moisture, and also adheres the first wiring layer and insulating film 213 above the first wiring layer together.

Polybenzoxazole (PBO) of a thickness ranging from 5 μm to 10 μm is provided on insulating film 211 to serve as insulating film 213. Insulating film 211 and insulating film 213 provided above the first wiring layer are hereinafter referred to as first interlayer insulating film 214.

Second source electrode wires 104 are provided on first interlayer insulating film 214 to be selectively connected to at least one of first source electrode wires 101 via openings of second source electrode wires 104. Referring to FIG. 2, openings of first interlayer insulating film 214 are provided above first source electrode wires 101 each of which is electrically connected to corresponding source electrode 207. With this structure, second source electrode wire 104 serves as a wiring layer having a potential equal to the potential of first source electrode wires 101 which are electrically connected to respective source electrodes 207 via the openings. Each of second source electrode wires 104 and second drain electrode wires 105 includes a layer comprising titanium (Ti), a layer comprising copper (Cu), and a layer comprising nickel (Ni). A thickness of the Ti layer ranges from 100 nm to 500 nm, a thickness of the Cu layer is 5 μm, and a thickness of the Ni layer is 1 μm. Second source electrode wires 104 and second drain electrode wires 105 are second electrode wires which are arranged in parallel. The second electrode wires are electrically connected to at least one of the first electrode wires.

A PBO layer having a thickness ranging from 10 μm to 20 μm is provided on each of second source electrode wires 104 to serve as second interlayer insulating film 216. Electrode pad layer 219 is provided on second interlayer insulating film 216 via openings of second interlayer insulating film 216, and selectively connected to at least one of second source electrode wire 104. In FIG. 2, an opening of second interlayer insulating film 216 is provided over a part of second source electrode wire 104 which is electrically connected to source electrodes 207 via first source electrode wires 101. Electrode pad layer 219 is connected to second source electrode wires 104 via the openings. With the above structure, electrode pad layer 219 is pads having a potential equal to a potential of source electrodes 207. Electrode pad layer 219 includes a Ti layer, Cu layer 217, and Ni layer 218. For example, the thickness of the Ti layer ranges from 100 nm to 500 nm, the thickness of Cu layer 217 is 5 μm, and the thickness of Ni layer 218 is 1 μm. Here, Cu layer 217 is formed by via filling plating. In the via filling plating, elements for suppression and acceleration are included as addition agents or the like in a plating solution, thereby prioritizing plating on vias to obtain flat finish shape. Protective film 220 comprising PBO is provided on electrode pad layer 219. Protective film 220 has a thickness ranging from 5 μm to 10 μm.

As seen in the wiring layout illustrated in FIG. 1, each of first source electrode wires 101 and first drain electrode wires 102 are divided by first gate electrode wires 103 into parts smaller than a chip size. As a result, the length of each of first source electrode wires 101 and the length of first drain electrode wires 102 decreases. As first source electrode wires 101 and first drain electrode wires 102 are longer, a wiring reliability, such as electric migration (EM) is lowered, resistance of first source electrode wires 101 and first drain electrode wires 102 increases, and thus on-resistance of the whole device increases. Furthermore, a source potential floats at the end of first source electrode wire 101 if first source electrode wire 101 is far from a part connecting first source electrode wire 101 to the wire in the second wiring layer. Moreover, regarding gate electrode 209 under first source electrode wire 101, a gate potential decreases due to gate leakage. Therefore, potential difference $\Delta V_{GS}$ between gate electrode 209 and source electrode 207 in each transistor is smaller than ideal potential difference. As a result, it is impossible to obtain sufficient maximum current. In order to obtain desirable properties of semiconductor device 1, it is therefore vital to divide each of first source electrode wires 101 and first drain electrode wires 102 to be shorter, and connect gate electrodes 209 by a thick integrating wire (first gate electrode wire 103).

Furthermore, each first gate electrode wire 103 is located in corresponding second region 151 in which first gate electrode wire 103 is located between longitudinal ends of first source electrode wires 101 and between longitudinal ends of first drain electrode wires 102. It should be noted that the ends of first source electrode wires 101 and first drain electrode wires 102 are not necessarily aligned, but are desirably arranged in a regular manner. As a result, it is possible to cause the properties of respective first source electrode wires 101 and first drain electrode wires 102 to be homogeneous.

In addition, as illustrated in FIG. 1, second source electrode wires 104 and second drain electrode wires 105 are alternately arranged. The position of first gate electrode wire 103 under second source electrode wire 104 is different from the position of first gate electrode wire 103 under second drain electrode wire 105. More specifically, under second source electrode wires 104, first gate electrode wires 103 are located in a lower position of the sheet of FIG. 1, while under second drain source electrode wires 105, first gate electrode wires 103 are located in an upper position of the sheet of FIG. 1, It should be noted that the whole layout of semiconductor device 1 illustrated in FIG. 1 may be implemented to a single chip. Hereinafter, it is assumed that the whole layout of semiconductor device 1 illustrated in FIG. 1 corresponds to one chip. Furthermore, hereinafter, a horizontal direction means a horizontal direction of the sheet of FIG. 1, and a vertical direction means a vertical direction of the sheet of FIG. 1. A left-right direction means a left-right direction of the sheet of FIG. 1. In semiconductor device 1, first gate electrode wire 103 divides each of first source electrode wires 101 and first drain electrode wires 102 by 2.5 division ratio in a horizontal direction of the chip. Here, the division ratio is constant in a vertical direction of the chip. The division by division ratio 2.5 means that each of first source electrode wires 101 and first drain electrode wires 102 is divided by two first gate wires 103 into parts having a length ratio of 1:1:0.5. The division by division ratio 1.5 means that each of first source electrode wires 101 and first drain electrode wires 102 is divided by one first gate wire 103 to parts having a length ratio of 1:0.5.

Referring to the layout illustrated in FIG. 8, there are two divided second wires 802 over first wires 801 arranged parallel in a longitudinal direction of first wires 801. In such a structure, a resistance component of first wire 801 which affects second wires 802 corresponds to a distance from a position connecting second wire 802 and first wire 801 to the end of first wire 801. With this structure, approximately a half of the length of first wire 801 contributes the above resistance component.

On the other hand, in the layout according to Embodiment 1 illustrated in FIG. 1, second source electrode wire 104 or second drain electrode wire 105 is provided over the center parts of first source electrode wires 101 and first drain electrode wires 102 arranged in parallel in a longitudinal direction of first source electrode wires 101 and first drain electrode wires 102. In this structure, a resistance component of each of first source electrode wires 101 and first drain electrode wires 102 which affects second source electrode wire 104 or second drain electrode wire 105 corresponds to approximately one fourth of the length of each of first source electrode wires 101 and first drain electrode wires 102. More specifically, in comparison to the semiconductor device illustrated in FIG. 8, semiconductor device 1 according to Embodiment 1 can reduce the wire resistance of the wires in the first wiring layer which affects the wires in the second wiring layer to approximately a half.

However, in the layout according to Embodiment 1 illustrated in FIG. 1, immediately under each of second source electrode wires 104 and second drain electrode wires 105, first region 152 which includes continuous parts of the wires in the first wiring layer and second region 151 which includes discontinuous parts of the wires (ends of the wires) in the wires in the first wiring layer are provided. In other words, second region 151 includes the longitudinal ends of first source electrode wires 101 and the longitudinal ends of first drain electrode wires 102, while first region 152 includes only continuous parts of first source electrode wires 101 and first drain electrode wires 102 arranged in parallel in the longitudinal direction. The wire in the second wiring layer over second region 151 has the same potential at any positions. Therefore, when an external connection terminal is bonded to the wire in the second wiring layer, the bonding damages layers under second region 151. In order to prevent this, in Embodiment 1, first gate electrode wires 103 are arranged zigzag on the chip in a horizontal direction of the sheet of FIG. 1. In other words, each of second source electrode wires 104 and second drain electrode wires 105 has second region 151 and first region 152 in a vertical direction on the chip. Then, the external connection terminals are bonded to second source electrode wires 104 and second drain electrode wires 105 only in first regions 152, which makes it possible to suppress damage caused by bonding to the external connection terminals while suppressing the wiring resistance of the first wiring layer. In other words, second source electrode wires 104 and second drain electrode wires 105 are arranged to regularly and alternately cover first region 152 and second region 151 so that first region 152 and second region 151 are arranged in a longitudinal direction of each of second source electrode wires 104 and second drain electrode wires 105. Furthermore, the external connection terminals are not bonded over second region 151. The external connection terminals are bonded over second source electrode wire 104 and second drain electrode wire 105 in first region 152. In FIG. 1, the region in which the external connection terminal is bonded is referred to as a bonding wire bonding region, which is shown as a region surrounded by a broken-line circle.

The following describes the results of the above-described examination of bonding damage. As a diameter of the external connection terminal is larger, the layers under the bonding region are more damaged. If external connection terminals are bonded over second regions 151 in Unsaturated Pressure Cooker Test (USPCT) as Highly Accelerated Stress Test (HAST) of 600 V, five out of five chips become defective in dozens of hours due to bonding damage. In contrast, if external connection terminals are bonded over first regions 152, all of five chips do not become defectives even after 100 hours or more has passed. The defective chips result from breakdown occurred in the vicinity of the end surfaces where the wires in the first wiring layer are discontinuous. In particular, considerable breakdown is seen at the contact end parts in which the first wiring layer and the second wiring layer are connected to each other. It is considered that the breakdown occurs due to failure of absorption of load concentration and ultrasound oscillation when bonding. On the other hand, in the case of bonding in first regions 152, since all the wires in the first wiring layer absorb the loads and ultrasound, breakdown caused by bonding is unlikely to occur. As explained above, it is important that the wires in the wiring layer and the connecting parts are continuous under each region for bonding the external connection terminals such as bonding wires.

It has been described in Embodiment 1 that each of first source electrode wires 101 and first drain electrode wires 102 is divided by division rate of 2.5, the present disclosure is not limited to the above and each of these wires may be divided by division ratio of 1.5 or higher with 0.5 increments. In this case, a higher division ratio (dividing into more pieces) more reduces the on-resistance which each of first source electrode wires 101 and first drain electrode wires 102 causes on the whole chip. However, since an active region in the chip is reduced by a region occupied by first gate electrode wires 103, a gate electrode width of the whole chip reduces and side-effects, such as on-resistance decrease and maximum current decrease, occur. In terms of the above, it is desirable to select the most efficient division ratio in consideration of the whole chip.

Furthermore, for example, when an external connection terminal that is a bonding wire comprising Al is connected to second source electrode wire 104 or second drain electrode wire 105, if they are connected in second region 151 which includes ends of first source electrode wires 101 and ends of first drain electrode wires 102 as discontinuous parts of the electrode wires, stress is concentrated on each of the ends and thereby easily damages first interlayer insulating film 214. In order to prevent this, the external connection terminal is connected in first region 152 which includes continuous parts of first source electrode wires 101 and first drain electrode wires 102 without their ends.

Although, in Embodiment 1, a so-called backing wire structure, in which source electrodes 207 are connected to first source electrode wire 101, drain electrodes 208 are connected to first drain electrode wire 102, and gate electrodes 209 are connected to first gate electrode wire 103, has been described as one example, it is also possible to eliminate such backing wires (first source electrode wires 101, first drain electrode wires 102, and first gate electrode wires 103) or use one or two kinds of backing wire(s).

It should be noted that in FIG. 2 on the rear surface of Si substrate 201 opposite to nitride semiconductor layer 203, rear surface electrode 221 comprising Ti, Cr, Ni, Ag, or the like is provided to apply a potential to the substrate from the outside.

[Method of Manufacturing Semiconductor Device]

Next, the method of manufacturing semiconductor device 1 according to Embodiment 1 is described.

FIGS. 3A to 3G are top views for explaining steps in the method of manufacturing semiconductor device 1 according to Embodiment 1.

Figure 3A:
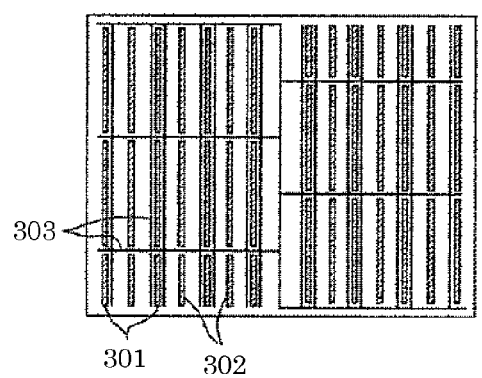
FIG. 3A is a top view for explaining a step in a method of manufacturing the semiconductor device according to Embodiment 1.

Referring first to FIG. 3A, source electrodes 301 corresponding to source electrodes 207 in FIG. 2, drain electrodes 302 corresponding to drain electrodes 208 in FIG. 2, and gate electrodes 303 corresponding to gate electrodes 209 in FIG. 2 are formed to have a wiring structure.

Figure 3B:
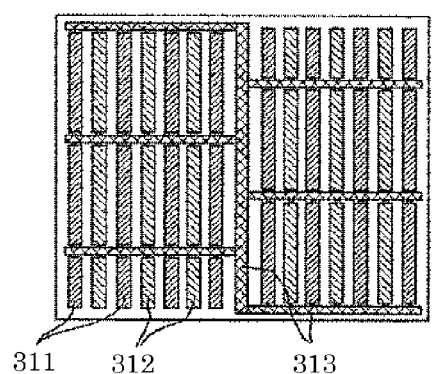
FIG. 3B is a top view for explaining a step in the method of manufacturing the semiconductor device according to Embodiment 1.

Referring now to FIG. 3B, the first wiring layer is stacked on source electrodes 301, drain electrodes 302, and gate electrodes 303. The first wiring layer includes: first gate electrode wires 313 connected to gate electrodes 303 to be integrated; first source electrode wires 311 connected to source electrodes 301; and first drain electrode wires 312 connected to drain electrodes 302. Transistors, each of which is one unit, are regularly arranged in such a way that two neighbor transistors are symmetrically arranged. With the structure, neighbor transistors can share the same source electrode and the same drain electrode to achieve the longest gate width on the small chip area. Gate electrodes 303 in each transistor are formed under first source electrode wire 311 as illustrated also in FIG. 2. Gate electrodes 303 are integrated together into first gate electrode wire 313 which is sandwiched by ends of first source electrode wires 311 and ends of first drain electrode wires 312.

More specifically, for example, if each of the electrode wires in the first wiring layer comprises Al, Au, or the like and has a width ranging from 10 μm to 16 μm approximately and a height ranging from 2 μm to 5 μm approximately, it is desirable that a first distance between a connecting part in which an electrode wire in the first wiring layer is connected with an electrode wire in the second wiring layer to the end of the electrode wire in the first wiring layer is 1 mm or shorter or that a second distance between the connecting part and a neighbor connecting part in which another electrode wire in the first wiring layer is connected to another electrode wire in the second wiring layer is 2 mm or shorter. When the first distance is 0. 5 mm or shorter and the second distance is 1 mm or shorter, it is possible to considerably suppress the decrease of a maximum current.

Moreover, as illustrated also in FIG. 1, first gate electrode wires 313 are arranged zigzag on the chip in a horizontal direction of the sheet of FIG. 1. Also in FIG. 3B, each of first source electrode wires 311 and first drain electrode wires 312 is divided by first gate electrode wires 313 by division ratio of 2.5 in a horizontal direction of the sheet of FIG. 3B. It should be noted that first source electrode wires 311 correspond to first source electrode wires 101 in FIG. 1, first drain electrode wires 312 correspond to first drain electrode wires 102 in FIG. 1, and first gate electrode wires 313 correspond to first gate electrode wires 103 in FIG. 1.

Figure 3C:
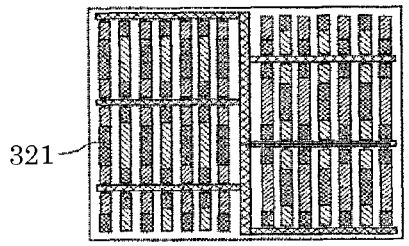
FIG. 3C is a top view for explaining a step in the method of manufacturing the semiconductor device according to Embodiment 1.

Referring to FIG. 3C, first interlayer insulating film 214 is formed on first gate electrode wires 313, first source electrode wires 311, and first drain electrode wires 312. In FIG. 3C, first interlayer insulating film 214 is not illustrated, but openings 321 are shown. At the subsequent step, each external connection terminal is to be connected over a region which includes continuous parts of first source electrode wires 311 and first drain electrode wires 312 without their ends. Therefore, it is necessary at this step illustrated in FIG. 3C to form each opening 321 in the center part of first source electrode wires 311 and first drain electrode wires 312. A length of each opening 321 is equal to or greater than the width required for a region (bonding region) in which an external connection terminal is connected. Furthermore, a length of each of first source electrode wires 311 and first drain electrode wires 312 is equal to or greater than double of the width of the bonding region for the external connection terminal.

If semiconductor device 1 according to Embodiment 1 is a power device such as a GaN device, the device is applied with a high voltage and a large amount of current flows in the device. Therefore, each bonding region for external connection terminal is set to have a width of several hundreds of μm or greater. Each bonding wire is required to have a diameter of, for example, 150 μm to 350 μm. If a typical Al bonding wire having a diameter of 250 μm is used, the width of the bonding region increases to 400 μm to 500 μm. Therefore, in order to prevent the ends of the wires in the first wiring layer from being located under bonding region for bonding the Al bonding wire, a length of each of first source electrode wires 311 and first drain electrode wires 312 is set to 400 μm or greater. Furthermore, it is necessary that each of divided parts of first source electrode wires 311 and first drain electrode wires 312 is connected to, for example, at least two wires (second source electrode wire 331 and second drain electrode wire 332) included in the second wiring layer which are located over the divided parts and have different potentials of a source potential and a drain potential. It is therefore necessary for each of first source electrode wires 311 and first drain electrode wires 312 to have a predetermined length longer than the width of the bonding region. Therefore, since the predetermined length is equal to or greater than double of the width of the bonding region, a maximum division ratio is approximately 2.5 if the width of the chip in a vertical direction of the sheet of FIG. 3C ranges 2.5 mm to 3 mm.

Figure 3D:
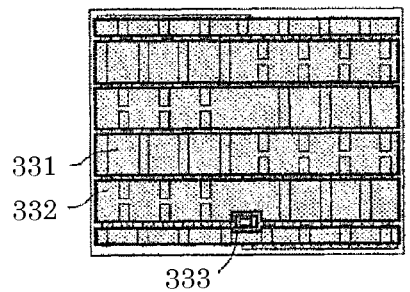
FIG. 3D is a top view for explaining a step in the method of manufacturing the semiconductor device according to Embodiment 1.

Referring to FIG. 3D, the second wiring layer is formed on first interlayer insulating film 214. The second wiring layer includes second source electrode wires 331 and second drain electrode wires 332 which are arranged to have a longitudinal direction perpendicular to a longitudinal direction of first source electrode wires 311 and first drain electrode wires 312. Each of second source electrode wires 331 is electrically connected to first source electrode wires 311 electrically connected to source electrodes 301. Each of second drain electrode wires 332 is electrically connected to first drain electrode wires 312 electrically connected to drain electrodes 302. Second source electrode wires 331 and second drain electrode wires 332 are alternately arranged. Furthermore, the second wiring layer also includes second gate electrode wires 333 each electrically connected to first gate electrode wires 313 electrically connected to gate electrodes 303. It should be noted that second source electrode wires 331 correspond to second source electrode wires 104 in FIG. 1 and second drain electrode wires 332 correspond to second drain electrode wires 105 in FIG. 1.

In Embodiment 1, the chip includes at least one second source electrode wire 331 electrically connected to source electrodes 301 and at least one second drain electrode wires 332 electrically connected to drain electrodes 302. Furthermore, a width of each of second source electrode wires 331 and second drain electrode wires 332 is constant in a longitudinal direction of the wire.

Figure 3E:
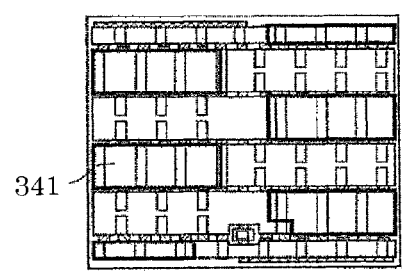
FIG. 3E is a top view for explaining a step in the method of manufacturing the semiconductor device according to Embodiment 1.

Referring to FIG. 3E, second interlayer insulating film 216 is formed. In FIG. 3E, second interlayer insulating film 216 is not illustrated, but openings 341 are shown. The chip includes at least one opening 341 over each of second source electrode wires 331 electrically connected to source electrodes 301 and second drain electrode wires 332 electrically connected to drain electrodes 302. A width of each opening 341 is equal to or greater than a width of each bonding region in which an external connection terminal is to be bonded.

Figure 3F:
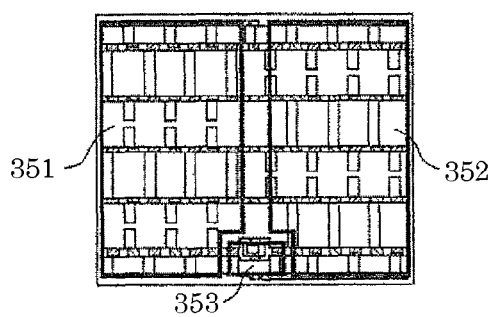
FIG. 3F is a top view for explaining a step in the method of manufacturing the semiconductor device according to Embodiment 1.

Referring to FIG. 3F, the electrode pad layer is formed on second interlayer insulating film 216. More specifically, source electrode pad 351 is formed to be electrically connected to source electrodes 301, drain electrode pad 352 is formed to be electrically connected to drain electrodes 302, and gate electrode pad 353 is formed to be electrically connected to gate electrodes 303. The size of each electrode pad is equal to or larger than a size necessary for bonding to the external connection terminal. The surfaces of the electrode pads are made of Ni. Bonding wires, ribbons, clips, or the like are bonded to the Ni surfaces to be connected to a substrate. Here, Ni has a high adhesion to Al bonding wires or Al ribbons, high barrier properties, and a high reliability.

Figure 3G:
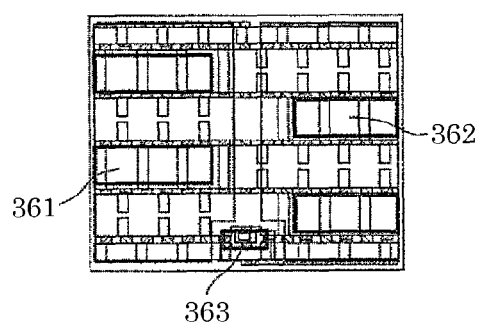
FIG. 3G is a top view for explaining a step in the method of manufacturing the semiconductor device according to Embodiment 1.

Finally, referring to FIG. 3G, protective film 220 is formed. In FIG. 3G, protective film 220 is not illustrated, but openings 361, 362, and 363 are shown. In the terms of a chip reliability and adhesion to sealing resin, it is desirable that the openings are formed only in bonding regions for the external connection terminals and that the other regions except the bonding regions are covered by protective film 220. If the reliability and the adhesion to sealing resin are sufficient, protective film 220 is not necessarily provided. Moreover, even if protective film 220 is provided, each of the openings may be larger as long as the opening is smaller than the area of the electrode pad layer. As described above, semiconductor device 1 according to Embodiment 1 is manufactured.

Although it has been described in Embodiment 1 that PBO films are used as insulating film 213, second interlayer insulating film 216, and protective film 220, it is also possible to use organic films, such as polyimide films, benzocyclobutene (BCB) films, SU-8 films, or AL-X2 films. Furthermore, insulating film 213, second interlayer insulating film 216, and protective film 220 are not necessarily made of a single material, but may be made of a combination of the above materials. As a result, it is possible to form films taking advantages of characteristics of each material. Furthermore, since these organic films can be formed by spin coating, it is easily perform embedding in recessed parts, thereby easily flattening the top surface of the interlayer insulating film. Moreover, although the openings of second interlayer insulating film 216 are preferably formed by photolithography, it is possible to form the openings by dry etching using $SiO_2$ or the like as hard mask. Water permeability and moisture resistance of organic materials significantly vary depending on types of materials. For example, polyimide having hygroscopicity has a risk of swelling the insulating film and thereby decreasing a reliability of semiconductor device 1 due to cracking and water. In this case, it is preferable to form a water-resistant film, such as an SiN film, on the polyimide film, and form the openings by dry etching.

Furthermore, although insulating film 211 is a single SiN film, it is also possible, in the terms of a reliability, to have a multilayer inorganic film including a SiN film, a $SiO_2$ film, and another SiN film which are sequentially stacked in this order. In this case, the SiN films suppress deterioration of semiconductor device 1 caused by water, and the $SiO_2$ film relaxes electric field and suppresses concave curving. On the other hand, it is also possible that insulating film 211 is not provided but first interlayer insulating film 214 includes only insulating film 213 that is an organic film.

Furthermore, although insulating films 206 and 211 have been described as SiN films, they may be $SiO_2$ films or the like. However, it is desirable that one of insulating films 206 and 211 is a SiN film having a high moisture resistance. The SiN film, the $SiO_2$ film, and the like can be formed by plasma-enhanced Chemical Vapor Deposition (CVD).

Although it has been described that the openings of first interlayer insulating film 214 are desirably formed by photolithography, hard baking of PBO, BCB, and the like is likely to expand the openings to be larger than they are before development. In this case, a distance between an opening and a neighbor opening becomes sometimes shorter than a distance between the opening and neighbor first source electrode wire 101. If the shortest distance among the neighbor openings is expressed as S (m), and a dielectric breakdown voltage at first interlayer insulating film 214 is expresses as A (V/m), it is necessary to satisfy at least $S \geq V/A$ to achieve a breakdown voltage V (V) or higher. In order to achieve a withstand voltage of 600 V as one index for a withstand voltage of a power device, it is necessary to satisfy $S \geq 600/A$. In Embodiment 1, a goal is a withstand voltage of 1000 V. Here, a dielectric breakdown voltage of the PBO film is 250 V/μm. Therefore, in order to cause S to be 5 μm or greater, a thickness of insulating film 213 is set to 10 μm. However, in practice, it is also possible to decrease the thickness of insulating film 213 in consideration of the dielectric breakdown voltage of insulating film 211.

It is also possible to set the thickness of second interlayer insulating film 216 in the same manner. It has been described in Embodiment 1 that the thickness of insulating film 213 is 10 μm. In practice, however, the thickness of insulating film 213 may be any width as long as the nearest distance between the second wiring layer and the electrode pad layer over the second wiring layer can produce a predetermined withstand voltage.

Although it has been described that source electrodes 207 and drain electrodes 208 comprise Ti or Al, it is also possible to use Ni, Au, vanadium (V), or hafnium (Hf) instead of or in addition to Ti or Al. These materials can be formed by lift-off technique or dry etching.

Although it has been also described that source electrodes 207 and drain electrodes 208 are provided below the interface between undoped AlGaN layer 205 and undoped GaN layer 204, it is also possible that source electrodes 207 and drain electrodes 208 are ohmic-connected on undoped AlGaN layer 205.

Although it has been described that gate electrodes 209 comprise Pd, Au, or Pt is also possible to use Ni, Ti, Al, Hf, or the like instead of or in addition to Pd, Au, or Pt. These materials can be formed by lift-off technique or dry etching.

It should be noted that the first wiring layer includes an adherence barrier layer comprising Tl, a conductive layer comprising Al, and an upper barrier layer. Here, the conductive layer in the first wiring may be made not only of pure Al but also of Al alloy including Si, Cu, or the like.

Although it has been described that the first wiring layer includes the adherence barrier layer comprising Tl, the conductive layer comprising Al, and the upper barrier layer comprising Ti, it is possible to eliminate the upper barrier layer. Furthermore, it is possible to use tantalum (Ta), Ni, TiN, TaN or the like instead of Ti. It is also possible to use Cu or Au instead of Al. Al has more advantages to cost and processability, but less advantages to EM in comparison to Au and Cu. These metals can be formed by plating or spattering.

Furthermore, as illustrated in FIG. 2, the external connection terminals are desirably connected to only regions of electrode pad layer 219 which have the same potentials as that of the second wiring layer in a vertical direction. If the external connection terminals are bonded directly onto the second wiring layer, the bonding is required for all second source electrode wires 104 and second drain electrode wires 105. In contrast, by connecting second source electrode wires 104 to one another or connecting second drain electrode wires 105 to one another on electrode pad layer 219, it is possible to reduce the number of the external connection terminals. Furthermore, the external connection terminals are bonded on regions of electrode pad layer 219 which have the same potentials as that of the second wiring layer in the vertical direction. With this structure, when there is no interlayer insulating film between the second wiring layer and electrode pad layer 219 under the bonding region, the bonding can bring the second wiring layer and electrode pad layer 219 into contact with each other. In addition, it is not necessary to consider damage caused by the contact. If there is an interlayer insulating film between the second wiring layer and electrode pad layer 219, the second wiring layer and electrode pad layer 219 have the same potential under the bonding region. Therefore, the damage does not directly affect the electric properties of semiconductor device 1.

Although it has been described that the second wiring layer and electrode pad layer 219 comprise Ti to have adhesion to lower layers, it is possible to use Ta, TaN, TiN, Ni, or the like instead of, in addition to, or to be combined with Ti. It is desirable that the layer for adhesion serves not only to enhance adhesion to second interlayer insulating film 216, but also to prevent diffusion of the conductive film.

Although it has been described that the second wiring layer comprises Cu, it is also possible to Au, Al, or the like instead or in addition to Cu.

The top surface of electrode pad layer 219 is desirably flat to enhance the adhesion to the external connection terminals, in particular, when bonding wires or ribbons are bonded. Therefore, it is desirable that electrode pad layer 219 includes at least Cu which can be used in via filling plating so that embedding of via can be prioritized by addition agent in plating. In Embodiment 1, Cu layer 217 is plated with Ti and Cu by Ti+Cu via filling plating. Furthermore, the second wiring layer may also be plated with Cu by Cu via filling plating.

The second wiring layer may include an Ni layer that ensures adhesion to second interlayer insulating film 216 and serves as a Cu diffusion barrier layer. It is desirable that this Ni layer is formed by plating following plating for forming of the layer under electrode pad layer 219. Since Ni does not have a high conductivity, increase of a thickness of the Ni layer increases contact resistance. In order to prevent this, the Ni layer is desirably thin. More specifically, the thickness of the Ni layer is desirably 1 µm or smaller, more particularly, in a range from dozens of nm to 500 nm, like the thickness generated by so-called flash plating. Furthermore, a glossiness of the Ni layer is desirably 1 or higher. More specifically, it is desirable that make-up solution for Ni plating is added with gloss agent, and watt bath is more desirable than sulfamate acid bath. If second interlayer insulating film 216 over the Ni layer is made of a photosensitive material, thick material is to be developed. If the material of the lower layer has a low glossiness, many residues on development occur. It is therefore desirable to increase a glossiness of the top surface of the second wiring layer.

Although it has been described that electrode pad layer 219 has Ni layer 218 as the top surface, it is desirable that Ni layer 218 is formed by plating following plating for forming Cu layer 217 under Ni layer 218. This is because it is desirable to provide an Ni or Ag layer as the top surface of electrode pad layer 219 if the external connection terminals, such as wires, ribbons, or clips, are made of Al. If the wires, ribbons, or clips are made of Au or Cu, the top surface layer of electrode pad layer 219 is desirably made of Au.

Although it has been described that the thickness of the first wiring layer is relatively thick and 2 µm, it is also possible to reduce the thickness depending on resistance components caused in each electrode wire. The thin first wiring layer can decrease a gap occurred in whole semiconductor device 1 and thereby improving adhesion of wire bonding. The resistance components of each electrode wire in the first wiring layer depends on a width of the electrode wire in the second wiring layer, in other words, a length of resistance components of the electrode wire in the first wiring layer. The resistance of the electrode wires in the first wiring layer is smaller, as the width of the electrode wire in the second wiring layer is smaller, the length of resistance components of the electrode wire in the first wiring layer is shorter, and the apparent number of electrode wires is increased. Therefore, it is possible to decrease the thickness of the first wiring layer.

In the same manner, the resistance of each electrode wire in the second wiring layer depends on the shape of electrode pad layer 219 in addition to the width and the thickness of the electrode wire. Therefore, the thickness of the second wiring layer is determined in consideration of an on-resistance value of whole semiconductor device 1.

Furthermore, when a bonding area for an external substrate is large like a bonding area of a flip chip, necessity of increasing the thickness of electrode pad layer 219 is low. However, if, for example, a wire is bonded on a part of a pad, sheet resistance from the bonding part directly affects on-resistance and therefore electrode pad layer 219 needs to be thick.

Furthermore, although it has been described in Embodiment 1 that electrode pad layer 219 is boded to the external connection terminals, it is also possible that the external connection terminals are directly connected to the second wiring layer. In this case, all the electrode wires in the second wiring layer need to be connected to the external connection terminals, or electrically connected to pads connected to the external connection terminals. For example, all the electrode wires in the second wiring layer are desirably connected to the external connection terminals in the outer periphery of the chip.

Although it has been described in Embodiment 1 that rear surface electrode 221 comprises Au or Sn, it is also possible to use Ti, Cr, Ni, Ag, or the like instead of or in addition to Au or Sn. These materials may be formed by spattering or evaporation technique.

Furthermore, it is possible that source electrodes 207 and rear surface electrode 221 are electrically connected to each other via Si substrate 201. It is also possible that source electrodes 207 and rear surface electrode 221 are connected to each other through buffer layer 202, by using Si substrate 201 as a conductive layer.

It has been described in Embodiment 1 that as illustrated in FIGS. 3A and 3B, gate electrodes 303 and first gate electrode wires 313 integrating gate electrodes 303 are arranged parallel to source electrodes 301 and drain electrodes 302 in a longitudinal direction of source electrodes 301 and drain electrodes 302 in non-active regions in the center part of the chip, in order to integrate gate electrodes 303 provided on the left and right parts of the chip. In other words, each of FIGS. 3A and 3B illustrates a wiring layout of gate electrodes 303 and first gate electrode wires 313.

Furthermore, in the example illustrated in FIGS. 3A and 3B, there is no gate electrodes 303 and first gate electrode wires 313 integrating gate electrodes 303 in the lower-left part and the upper-right part of the chip. The reason of the above structure is as follows. A wire resistance of gate electrodes 303 provided under long first source electrode wire 311 have a maximum value in the center part of first source electrode wire 311. In contrast, in the case of gate electrodes 303 provided under short first source electrode wire 311, the ends of gate electrodes 303 are open so that the wire resistance of gate electrodes 303 are homogeneous. This structure allows a rate of transmitting signals of the whole chip to be constant, and is therefore desirable as a radio-frequency device.

However, the layout of the integrating wires is not limited to this. The following describes other layouts of the integrating wires.

Figure 4A:
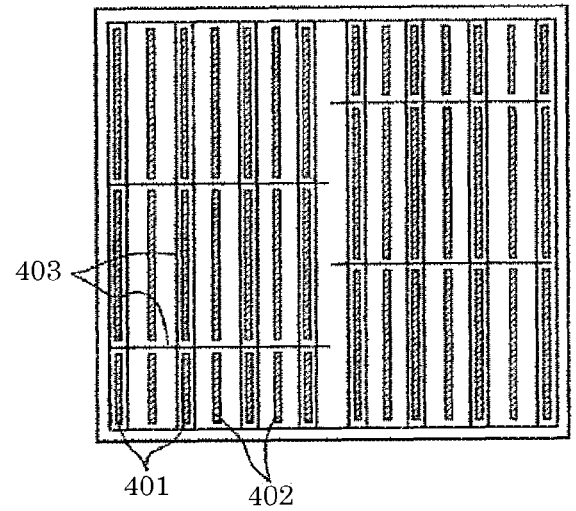
FIG. 4A is a top view for explaining an integrating wiring layout of a semiconductor device according to Variation 1 of Embodiment 1.
Figure 4B:
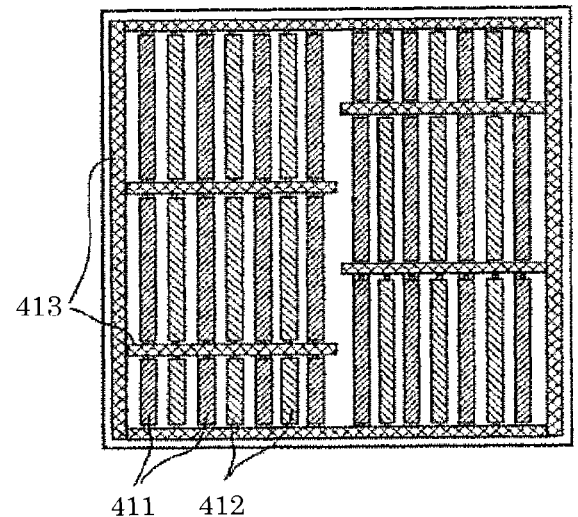
FIG. 4B is a top view for explaining an integrating wiring layout of the semiconductor device according to Variation 1 of Embodiment 1.

Variation 1 of Embodiment 1, Another Layout of Integrating Wires of Semiconductor Device FIGS. 4A and 4B are top views for explaining a layout of integrating wires in a semiconductor device according to Variation 1 of Embodiment 1. FIG. 4A illustrates a layout of electrodes, and FIG. 4B illustrates a layout of wires.

Source electrodes 401, drain electrodes 402, and gate electrodes 403 in FIG. 4A correspond to source electrodes 301, drain electrodes 302, and gate electrodes 303 in FIG. 3A, respectively. Furthermore, first source electrode wires 411, first drain electrode wires 412, first gate electrode wires 413 in FIG. 4B correspond to first source electrode wires 311, first drain electrode wires 312, first gate electrode wires 313 in FIG. 3B, respectively.

In Variation 1, first gate electrode wires 413 are provided in the outer periphery of the chip. In other words, gate electrodes 403 and first gate electrode wires 413 integrating gate electrodes 403 are arranged in the outer periphery of the chip. This is a difference from Embodiment 1 illustrated in FIG. 3B.

As illustrated in FIGS. 4A and 4B, gate electrodes 403 and first gate electrode wires 413 integrating gate electrodes 403 may be disposed in the outer periphery of the chip.

Figure 5A:
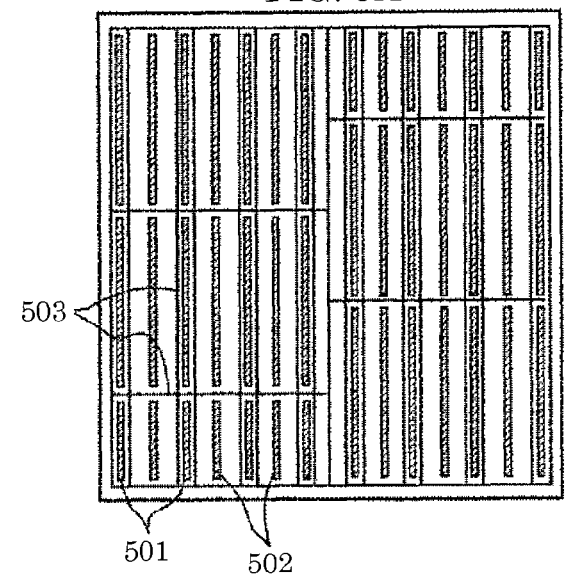
FIG. 5A is a top view for explaining an integrating wiring layout of a semiconductor device according to Variation 2 of Embodiment 1.
Figure 5B:
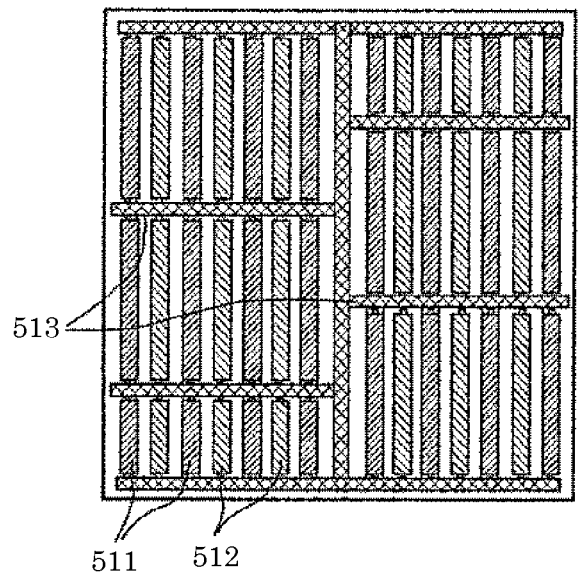
FIG. 5B is a top view for explaining an integrating wiring layout of the semiconductor device according to Variation 2 of Embodiment 1.

Variation 2 of Embodiment 1, Still Another Layout of Integrating Wires of Semiconductor Device FIGS. 5A and 5B are top views for explaining a layout of integrating wires in a semiconductor device according to Variation 2 of Embodiment 1. FIG. 5A illustrates a layout of electrodes, and FIG. 5B illustrates a layout of wires.

Source electrodes 501, drain electrodes 502, and gate electrodes 503 in FIG. 5A correspond to source electrodes 301, drain electrodes 302, and gate electrodes 303 in FIG. 3A, respectively. Furthermore, first source electrode wires 511, first drain electrode wires 512, first gate electrode wires 513 in FIG. 5B correspond to first source electrode wires 311, first drain electrode wires 312, first gate electrode wires 313 in FIG. 3B, respectively.

In Variation 2, first gate electrode wires 513 are provided in the center part of the chip and in the vicinity of the ends of the chip. In other words, gate electrodes 503 and first gate electrode wires 513 integrating gate electrodes 503 are arranged in the vicinity of all the ends of the chip. This is a difference from Embodiment 1 illustrated in FIG. 3B.

As illustrated in FIGS. 5A and 5B, if it is not necessary to cause the wire resistance to be homogeneous as described previously, the ends of all the wires may be surrounded by gate electrodes 503 and first gate electrode wires 513.

When the external connection terminals are bonded above the second wiring layer, the bonding causes stress on portions of the first wiring layer under the bonding regions. The damage caused by the stress to the first wiring layer is likely to be concentrated in second region 151 in which each of the first electrode wires is discontinuous. On the other hand, the damage is reduced in first region 152 in which each of the first electrode wires is continuous under the bonding region.

The structure of semiconductor device 1 according to Embodiment 1 and Variations 1 and 2 can suppress the damage caused by the external connection terminals. Furthermore, the second electrode wires are arranged to alternately cover first regions 152 and second regions 151 in a direction perpendicular to the longitudinal direction of the second electrode wires, and the pads for the external connection terminals are selectively provided over first regions 152. It is therefore possible to prevent that the first electrode wire extends under two neighbor second electrode wires. This structure can decrease a length of the first electrode wires, thereby preventing increase of on-resistance and decrease of a maximum current amount caused by decrease of a gate potential.

Embodiment 2

The following describes Embodiment 2, explaining mainly differences from Embodiment 1.

FIGS. 6A to 6G are top views for explaining steps in a method of manufacturing a semiconductor device according to Embodiment 2. It should be noted that the cross-sectional structure of the semiconductor device according to Embodiment 2 is the same as that according to Embodiment 1.

Figure 6A:
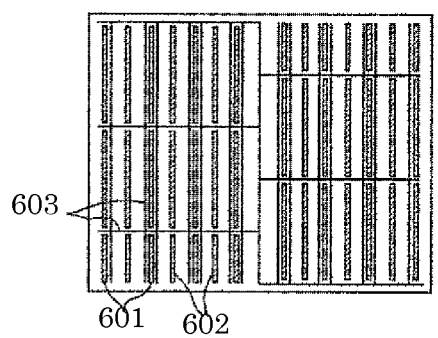
FIG. 6A is a top view for explaining a step in a method of manufacturing a semiconductor device according to Embodiment 2.

Referring first to FIG. 6A, source electrodes 601 corresponding to source electrodes 207 in FIG. 2, drain electrodes 602 corresponding to drain electrodes 208 in FIG. 2, and gate electrodes 603 corresponding to gate electrodes 209 in FIG. 2 are formed to have a wiring structure.

Figure 6B:
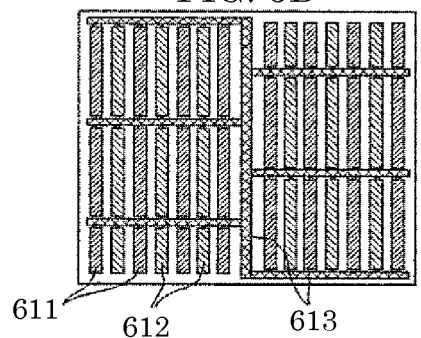
FIG. 6B is a top view for explaining a step in the method of manufacturing the semiconductor device according to Embodiment 2.

Referring now to FIG. 6B, as backing wires integrating gate electrodes 603, first gate electrode wires 613 are formed in the first wiring layer. Furthermore, as backing wires for source electrode layers 601, first source electrode wires 611 are formed in the first wiring layer. As backing wires for drain electrodes 602, first drain electrode wires 612 are formed in the first wiring layer. Gate electrode 603 in each transistor is formed under first source electrode wire 611. First gate electrode wires 613 are integrated at ends of first source electrode wires 611 and first drain electrode wires 612.

First gate electrode wires 613 are arranged zigzag on the chip in a horizontal direction of the sheet of FIG. 6B.

Although it has been described in Embodiment 2 that gate electrodes 603, source electrodes 601, and drain electrodes 602 are backed by the first wiring layer, it is also possible to eliminate such backing wires or use one or two kinds of backing wire(s).

Figure 6C:
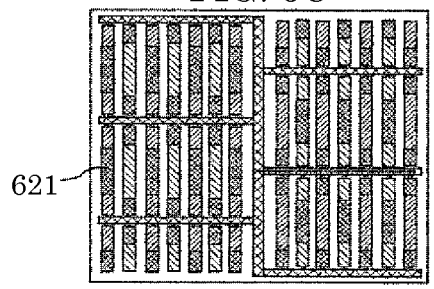
FIG. 6C is a top view for explaining a step in the method of manufacturing the semiconductor device according to Embodiment 2.

Referring to FIG. 6C, first interlayer insulating film 214 is formed on first gate electrode wires 613, first source electrode wires 611, and first drain electrode wires 612. In FIG. 6C, first interlayer insulating film 214 is not illustrated, but openings 621 are shown. At the subsequent step, each external connection terminal is to be connected over a region which includes continuous parts of first source electrode wires 611 and first drain electrode wires 612 without their ends. Therefore, it is necessary at this step illustrated in FIG. 6C to form each opening 621 in the center part of first source electrode wires 611 and first drain electrode wires 612. A length of each opening 621 is equal to or greater than the width required for a region (bonding region) in which an external connection terminal is connected. Furthermore, a length of each of first source electrode wires 611 and first drain electrode wires 612 is equal to or greater than double of the width of the bonding region for the external connection terminal.

Figure 6D:
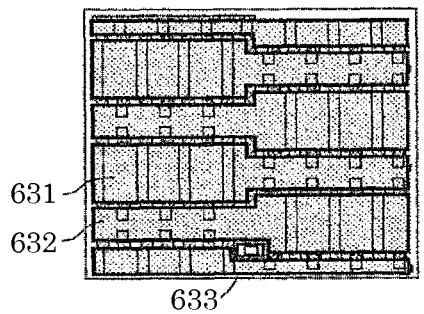
FIG. 6D is a top view for explaining a step in the method of manufacturing the semiconductor device according to Embodiment 2.

Referring to FIG. 6D, the second wiring layer is formed on first interlayer insulating film 214. The second wiring layer includes second source electrode wires 631 and second drain electrode wires 632 which are arranged to have a longitudinal direction perpendicular to a longitudinal direction of first source electrode wires 611 and first drain electrode wires 612. Each of second source electrode wires 631 is electrically connected to first source electrode wires 611 electrically connected to source electrodes 601. Each of second drain electrode wires 632 is electrically connected to first drain electrode wires 612 electrically connected to drain electrodes 602. Second source electrode wires 631 and second drain electrode wires 632 are alternately arranged. Furthermore, the second wiring layer also includes second gate electrode wires 633 each electrically connected to first gate electrode wires 613 electrically connected to gate electrodes 603.

In Embodiment 2, the chip includes at least one second source electrode wire 631 which has a width equal to or greater than the width required for an external connection terminal and is electrically connected to source electrodes 601, and at least one second drain electrode wire 632 which has a width equal to or greater than the width required for an external connection terminal and is electrically connected to drain electrodes 602. Furthermore, each of second source electrode wires 631 and second drain electrode wires 632 has different widths in a longitudinal direction of the wire. More specifically, each of second source electrode wires 631 and second drain electrode wires 632 has: a region over second regions 151 in which each of wires in the first wiring layer are discontinuous and each of which includes ends of the wires in the first wiring layer; and the other region over first regions 152 in each of which wires in the first wiring layer are continuous. Here, the region over second regions 151 is thin and the region over first regions 152 is thick.

Figure 6E:
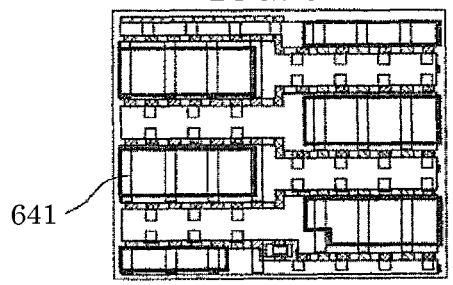
FIG. 6E is a top view for explaining a step in the method of manufacturing the semiconductor device according to Embodiment 2.

Referring to FIG. 6E, second interlayer insulating film 216 is formed. In FIG. 6E, second interlayer insulating film 216 is not illustrated, but openings 641 are shown. The chip includes at least one opening 641 over each of second source electrode wires 631 electrically connected to source electrodes 601 and second drain electrode wires 632 electrically connected to drain electrodes 602. A width of each opening 641 is equal to or greater than a width of each bonding region in which an external connection terminal is to be bonded.

Figure 6F:
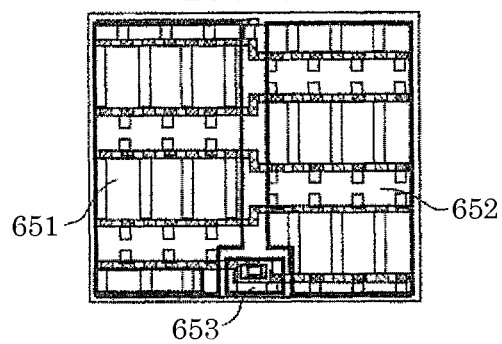
FIG. 6F is a top view for explaining a step in the method of manufacturing the semiconductor device according to Embodiment 2.

Referring to FIG. 6F, the electrode pad layer is formed on second interlayer insulating film 216. More specifically, source electrode pad 651 is formed to be electrically connected to source electrodes 601, drain electrode pad 652 is formed to be electrically connected to drain electrodes 602, and gate electrode pad 653 is formed to be electrically connected to gate electrodes 603. The size of each electrode pad is equal to or larger than a size necessary for bonding to the external connection terminal. The surfaces of the electrode pads are made of Ni. Bonding wires, ribbons, clips, or the like are bonded to the Ni surfaces to be connected to a substrate. Here, Ni has a high adhesion to Al bonding wires or Al ribbons, high barrier properties, and a high reliability.

Figure 6G:
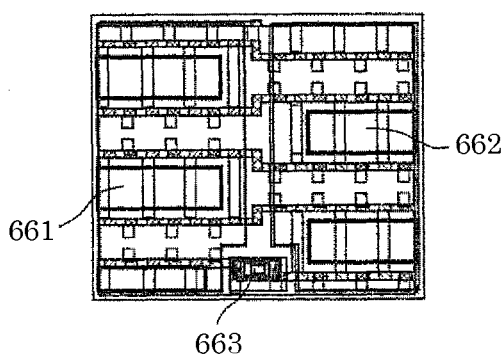
FIG. 6G is a top view for explaining a step in the method of manufacturing the semiconductor device according to Embodiment 2.

Referring to FIG. 6G, protective film 220 is formed. In FIG. 6G, protective film 220 is not illustrated, but openings 661, 662, and 663 are shown. In the terms of a chip reliability and adhesion to sealing resin, it is desirable that the openings are formed only in bonding regions for the external connection terminals and that the other regions except the bonding regions are covered by protective film 220. If the reliability and the adhesion to sealing resin are sufficient, protective film 220 is not necessarily provided. Moreover, even if protective film 220 is provided, each of the openings may be larger as long as the opening is smaller than the area of the electrode pad layer. As described above, semiconductor device 2 according to Embodiment 1 is manufactured.

As described above, according to Embodiment 2, regarding each of second source electrode wires 631 and second drain electrode wires 632, a width over first regions 152 is greater than a width over second regions 151. Therefore, regarding each of second source electrode wires 631 and second drain electrode wires 632, in the region in which the external connection terminal is not connected to the wire, the wire does not need have an enough width for bonding. In other words, it is also possible for each of second source electrode wires 631 and second drain electrode wires 632 that the region over second regions 151 is thin. This structure can reduce a length of first source electrode wires 611 and first drain electrode wires 612, thereby suppressing increase of on-resistance and decrease of a maximum current amount caused by decrease of a gate potential.

Although the semiconductor device according to the present disclosure has been described based on above Embodiments and Variations, the semiconductor device according to the present disclosure is not limited to above Embodiments and Variations. Those skilled in the art will be readily appreciate that various desired combinations and modifications of the structural elements in Embodiments and Variations are possible without materially departing from the novel teachings and advantages of the present disclosure. Accordingly, all such modifications and combinations and also various devices including such semiconductor device according to the present disclosure are intended to be included within the scope of the present disclosure.

It should be noted that the semiconductor device according to the present disclosure is not limited to the semiconductor device including transistors comprising nitride semiconductor, but may be in any forms, such as a semiconductor device including field-effect transistors not comprising nitride semiconductor or a semiconductor device as a diode.

INDUSTRIAL APPLICABILITY

The semiconductor device according to the present disclosure is useful, in particular, as a nitride semiconductor device or the like which is used as a power device in a power source circuit or the like in a consumer equipment.

What is claimed is:

1. A semiconductor device comprising:
    an electrode layer disposed in an active region above a semiconductor substrate;
    a first wiring layer disposed above the electrode layer; and
    a second wiring layer disposed above the first wiring layer,
    wherein the first wiring layer includes a plurality of first electrode wires electrically connected to element electrodes included in the electrode layer,
    the second wiring layer includes a plurality of second electrode wires arranged parallel to each other and electrically connected to at least one of the first electrode wires,
    the first wiring layer includes first regions and second regions, and in a plan view of the semiconductor substrate, the first electrode wires are each continuous in the first regions and each discontinuous in the second regions,
    the second electrode wires are arranged to regularly and alternately cover the first regions and the second regions, a corresponding one of the first regions and a corresponding one of the second regions being arranged in a longitudinal direction of each of the second electrode wires, and
    external connection terminals are not bonded over the second regions and are bonded over the second electrode wires over the first regions.

2. The semiconductor device according to claim 1,
    wherein each of the second regions includes longitudinal ends of at least one of the first electrode wires, and
    each of the first regions is free from longitudinal ends of the first electrode wires.

3. The semiconductor device according to claim 2,
    wherein the electrode layer includes a gate electrode, a source electrode, and a drain electrode,
    the first electrode wires include a first gate electrode wire electrically connected to the gate electrode, a first source electrode wire electrically connected to the source electrode, and a first drain electrode wire electrically connected to the drain electrode, and
    the first gate electrode wire is disposed between longitudinal ends of first source electrode wires including the first source electrode wire and between longitudinal ends of first drain electrode wires including the first drain electrode wire in each of the second regions.

4. The semiconductor device according to claim 1, further comprising
    an electrode pad layer disposed above the second wiring layer,
    wherein the external connection terminals are bonded only in a part of the electrode pad layer, the part having a same potential as a potential of the second wiring layer in a vertical direction.

5. The semiconductor device according to claim 1,
    wherein each of the second electrode wires includes regions having different widths.

6. The semiconductor device according to claim 5,
    wherein each of the second electrode wires has a first width over at least one of the first regions and a second width over at least one of the second regions, the first width being greater than the second width.

* * * * *